(12) United States Patent
Xu et al.

(10) Patent No.: US 12,310,141 B2
(45) Date of Patent: May 20, 2025

(54) SOLAR CELL AND PHOTOVOLTAIC MODULE

(71) Applicants: JINKO SOLAR (HAINING) CO., LTD., Zhejiang (CN); ZHEJIANG JINKO SOLAR CO., LTD., Zhejiang (CN)

(72) Inventors: Menglei Xu, Zhejiang (CN); Jie Yang, Zhejiang (CN); Xinyu Zhang, Zhejiang (CN); Hao Jin, Zhejiang (CN)

(73) Assignees: JINKO SOLAR (HAINING) CO., LTD., Zhejiang (CN); ZHEJIANG JINKO SOLAR CO., LTD., Zhejiang (CN)

( * ) Notice: Subject to any disclaimer, the term of this patent is extended or adjusted under 35 U.S.C. 154(b) by 0 days.

(21) Appl. No.: 18/599,055

(22) Filed: Mar. 7, 2024

(65) Prior Publication Data

US 2024/0250204 A1  Jul. 25, 2024

Related U.S. Application Data

(63) Continuation of application No. 17/549,029, filed on Dec. 13, 2021, now Pat. No. 11,949,038.

(30) Foreign Application Priority Data

Nov. 5, 2021  (CN) .......................... 202111306497.6

(51) Int. Cl.
 *H10F 10/14* (2025.01)
 *H10F 71/00* (2025.01)
 (Continued)

(52) U.S. Cl.
 CPC ......... *H10F 71/128* (2025.01); *H10F 10/146* (2025.01); *H10F 71/121* (2025.01);
 (Continued)

(58) Field of Classification Search
 CPC .......... H01L 33/0016; H01L 31/02167; H01L 31/02168; H01L 31/02363; H01L 31/0682;
 (Continued)

(56) References Cited

U.S. PATENT DOCUMENTS 9,929,294 B2 * 3/2018 Tokioka ............ H01L 31/02167
10,424,681 B2 * 9/2019 Lee ..................... H01L 31/0745
(Continued)

FOREIGN PATENT DOCUMENTS

CN  103794679 A  5/2014
CN  203760487 U  8/2014
(Continued)

OTHER PUBLICATIONS

Extended European Search Report of Application No. 21214026.3 (reference No. 44270056EP), dated Feb. 3, 2022, in 8 pages.
(Continued)

*Primary Examiner* — Earl N Taylor
(74) *Attorney, Agent, or Firm* — Knobbe, Martens, Olson & Bear, LLP

(57) ABSTRACT

A solar cell and a photovoltaic module is disclosed. The solar cell includes a silicon substrate, and the silicon substrate includes a front surface and a back surface arranged opposite to each other. P-type conductive regions and N-type conductive regions are alternately arranged on the back surface of the silicon substrate. Front surface field regions are located on the front surface of the silicon substrate and spaced from each other. The front surface field regions each corresponds to one of the P-type conductive regions or one of the N-type conductive regions. At least one front passivation layer is located on the front surface of the
(Continued)

silicon substrate. At least one back passivation layer is located on surfaces of the P-type conductive regions and N-type conductive regions.

20 Claims, 5 Drawing Sheets

(51) Int. Cl.
*H10F 77/30* (2025.01)
*H10F 77/70* (2025.01)

(52) U.S. Cl.
CPC ......... *H10F 71/129* (2025.01); *H10F 77/311* (2025.01); *H10F 77/315* (2025.01); *H10F 77/703* (2025.01); *Y02E 10/546* (2013.01); *Y02E 10/547* (2013.01); *Y02P 70/50* (2015.11)

(58) Field of Classification Search
CPC ............. H01L 31/1804; H01L 31/1864; H01L 31/1868; H10F 71/128; H10F 10/146; H10F 71/121; H10F 71/129; H10F 77/311; H10F 77/315; H10F 77/703; H10F 10/165; Y02E 10/546; Y02E 10/547; Y02P 70/50
See application file for complete search history.

(56) References Cited

U.S. PATENT DOCUMENTS

| | | | |
|---|---|---|---|
| 10,516,066 B2 | 12/2019 | Higashikawa et al. | |
| 10,991,838 B1* | 4/2021 | Yang | H01L 31/02167 |
| 11,949,038 B2* | 4/2024 | Xu | H01L 33/0016 |
| 2009/0151784 A1* | 6/2009 | Luan | H01L 31/02366 |
| | | | 438/69 |
| 2010/0018565 A1 | 1/2010 | Funakoshi | |
| 2010/0087031 A1 | 4/2010 | Veschetti et al. | |
| 2010/0263722 A1 | 10/2010 | Kubo et al. | |
| 2011/0308591 A1* | 12/2011 | Yamazaki | H01L 31/02168 |
| | | | 136/255 |
| 2012/0211063 A1* | 8/2012 | Lee | H01L 31/075 |
| | | | 257/E51.026 |
| 2013/0037102 A1* | 2/2013 | Isaka | H01L 31/0682 |
| | | | 257/E31.124 |
| 2013/0056051 A1* | 3/2013 | Jin | H01L 31/022425 |
| | | | 257/E31.032 |
| 2014/0311563 A1 | 10/2014 | Jaffrennou et al. | |
| 2015/0007867 A1* | 1/2015 | Tokioka | H01L 31/1804 |
| | | | 438/96 |
| 2015/0214392 A1 | 7/2015 | Buckley et al. | |
| 2015/0243806 A1* | 8/2015 | Hu | H01L 31/186 |
| | | | 438/71 |
| 2015/0287849 A1* | 10/2015 | Kim | H01L 31/0745 |
| | | | 438/98 |
| 2016/0005900 A1 | 1/2016 | Lee et al. | |
| 2016/0049538 A1* | 2/2016 | Cesar | H01L 31/0682 |
| | | | 438/80 |
| 2017/0213921 A1* | 7/2017 | Yang | H01L 31/0682 |
| 2018/0053873 A1* | 2/2018 | Doll | H01L 31/0682 |
| 2018/0122640 A1* | 5/2018 | Doll | H01L 21/2254 |
| 2018/0226523 A1* | 8/2018 | Kim | H01L 31/022425 |
| 2019/0348560 A1* | 11/2019 | Dahlinger | H01L 31/1868 |
| 2023/0143714 A1* | 5/2023 | Xu | H01L 33/0016 |
| | | | 257/79 |
| 2024/0072196 A1* | 2/2024 | Xu | H01L 31/02363 |
| 2024/0250204 A1* | 7/2024 | Xu | H01L 31/0682 |

FOREIGN PATENT DOCUMENTS

| | | |
|---|---|---|
| CN | 105609571 A | 5/2016 |
| CN | 106252449 A | 12/2016 |
| CN | 207818594 U | 9/2018 |
| CN | 109524480 A | 3/2019 |
| CN | 111755552 A | 10/2020 |
| EP | 2930755 A1 | 10/2015 |
| JP | 2015-216215 A | 12/2015 |
| WO | WO 2012/176839 A1 | 12/2012 |

OTHER PUBLICATIONS

First Chinese Office Action in Chinese Application No. 202111306497.6 dated Dec. 18, 2023 in 16 pages.

* cited by examiner

SOLAR CELL AND PHOTOVOLTAIC MODULE

CROSS-REFERENCE TO RELATED APPLICATIONS

The present application is a continuation of U.S. application Ser. No. 17/549,029, filed on Dec. 13, 2021, which claims priority to Chinese Patent Application No. 202111306497.6, filed on Nov. 5, 2021, the contents of which are incorporated herein by reference in their entireties.

TECHNICAL FIELD

The present disclosure relates to the technical field of photovoltaic device, and in particular, to a solar cell and a photovoltaic module.

BACKGROUND

An interdigitated back contact (IBC) solar cell is a back-contact solar cell, whose emitters and metal contacts are located on a back surface of the solar cell, which breaks structural limitations of a conventional front-contact solar cell. The IBC solar cell can be achieved with a higher short circuit Jsc, which provides a larger space for conversion efficiency of the solar cell, and is aesthetically pleasing and easier to assemble. The IBC solar cell is one of technical trends to realize high-efficiency crystalline silicon solar cells.

Since both the emitters and the metal contacts are located on the back surface of the solar cell, photogenerated carriers are generated mainly on a front surface (i.e., light receiving surface) of the solar cell, and the carriers can be collected only by passing through a thickness of an entire silicon wafer to reach the back surface of the solar cell. In an existing IBC solar cell, a passivation layer is generally deposited on a front surface of the solar cell, so as to improve a passivation effect on the front surface of the solar cell. However, the passivation layer is of limited use to improve the passivation effect on the front surface of the solar cell, and a large number of carriers are still recombined before reaching the back surface of the solar cell. Therefore, the passivation effect on the front surface of the solar cell is undesired, which may bring adverse effects to the conversion efficiency of the solar cell.

SUMMARY

In order to overcome the above defects, a solar cell and a photovoltaic module are provided, which help to improve the passivation effect on the front surface of the solar cell and the conversion efficiency of the solar cell.

In a first aspect, according to some embodiments of the present disclosure, a solar cell is provided, including: a silicon substrate having a front surface and a back surface arranged opposite to each other; P-type conductive regions and N-type conductive regions alternately arranged on the back surface of the silicon substrate; front surface field regions located on the front surface of the silicon substrate and spaced from each other; at least one front passivation layer located on the front surface of the silicon substrate; and at least one back passivation layer located on surfaces of the P-type conductive regions and N-type conductive regions. The front surface field regions are each corresponds to one of the P-type conductive regions or one of the N-type conductive regions.

In one or more embodiment, the silicon substrate is an N-type substrate, the front surface field regions each corresponds to one of the N-type conductive regions. Orthographic projections of the N-type conductive regions perpendicular to the front surface of the silicon substrate are within orthographic projections of the front surface field regions perpendicular to the front surface of the silicon substrate.

In one or more embodiment, at least part of orthographic projections of the P-type conductive regions perpendicular to the front surface of the silicon substrate are within the orthographic projections of the front surface field regions perpendicular to the front surface of the silicon substrate.

In one or more embodiment, the silicon substrate is a P-type substrate, the front surface field regions each corresponds to one of the P-type conductive regions. Orthographic projections of the P-type conductive regions perpendicular to the front surface of the silicon substrate are within orthographic projections of the front surface field regions perpendicular to the front surface of the silicon substrate.

In one or more embodiment, at least part of orthographic projections of the N-type conductive regions perpendicular to the front surface of the silicon substrate are within the orthographic projections of the front surface field regions perpendicular to the front surface of the silicon substrate.

In one or more embodiment, spacing regions are formed between adjacent ones of the P-type conductive region and the N-type conductive regions. Orthographic projections of the spacing regions perpendicular to the front surface of the silicon substrate are within the orthographic projections of the front surface field regions perpendicular to the front surface of the silicon substrate.

In one or more embodiment, the spacing region has a width in a range from 20 μm to 150 μm.

In one or more embodiment, the front surface field region has a width in a range from 200 μm to 300 μm.

In one or more embodiment, a total area of the front surface field regions accounts for 45% to 60% of an area of the front surface of the silicon substrate.

In one or more embodiment, the front surface field region has a doping concentration in a range from $5E18$ $cm^{-3}$ to $5E19$ $cm^{-3}$. The front surface field region has a doping junction depth in a range from 20 nm to 150 nm.

In a second aspect, according to some embodiments of the present disclosure, a photovoltaic module is provided, including: at least one solar cell string each formed by a plurality of solar cells through an electrical connection. At least one solar cell of the plurality of solar cells includes: a silicon substrate having a front surface and a back surface arranged opposite to each other; P-type conductive regions and N-type conductive regions alternately arranged on the back surface of the silicon substrate; front surface field regions located on the front surface of the silicon substrate and spaced from each other; at least one front passivation layer located on the front surface of the silicon substrate; and at least one back passivation layer located on surfaces of the P-type conductive regions and N-type conductive regions. The front surface field regions are each corresponds to one of the P-type conductive regions or one of the N-type conductive regions.

It should be understood that the general description above and the detailed description in the following are merely exemplary, and cannot be interpreted as limiting the present disclosure.

BRIEF DESCRIPTION OF DRAWINGS

In order to better illustrate the technical solutions in embodiments of the present disclosure, the accompanying drawings used in the description of the embodiments will be briefly introduced below. It is apparent that the accompanying drawings in the following description are only some embodiments of the present disclosure, and other drawings can be obtained by those of ordinary skill in the art from the provided drawings without creative efforts.

DESCRIPTION OF EMBODIMENTS

Figure 1:
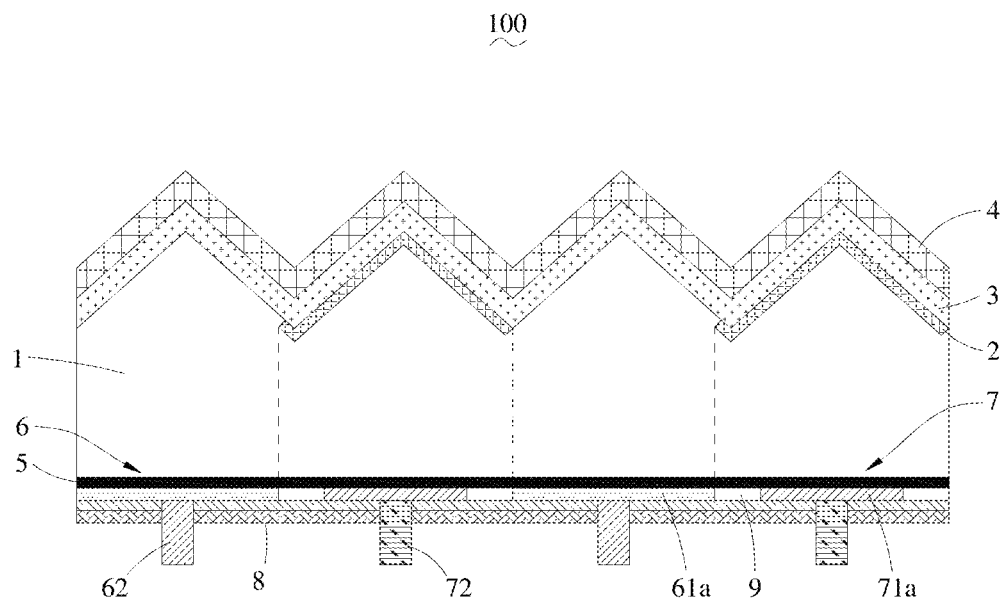
FIG. 1 is a first schematic structural diagram of a solar cell according to some embodiments of the present disclosure.

In order to better understand the technical solutions of the present disclosure, the following is a detailed description of embodiments of the present disclosure with reference to the accompanying drawings.

It should be made clear that the embodiments described are only part of rather than all of the embodiments of the present disclosure. All other embodiments acquired by those of ordinary skill in the art without creative efforts based on the described embodiments of the present disclosure shall fall within the protection scope of the present disclosure.

The terms used in the present disclosure are only intended to describe particular embodiments but not intended to limit the present disclosure. As used in the embodiments of the present disclosure and the appended claims, the singular forms of "a/an", "the", and "said" are intended to include plural forms, unless otherwise clearly specified by the context.

It is to be understood that the term "and/or" used herein is merely an association relationship describing associated objects, indicating that three relationships may exist. For example, A and/or B indicates that there are three cases of A alone, A and B together, and B alone. In addition, the character "/" herein generally means that associated objects before and after "/" are in an "or" relationship.

It is to be noted that orientation words such as "above", "below", "left" and "right" described in the embodiments of the present disclosure are described from the angles as shown in the accompanying drawings and should not be understood as limitations on the embodiments of the present disclosure. In addition, in the context, it is to be further understood that, when one element is connected "above" or "below" another element, it can be directly connected "above" or "below" the other element, or indirectly connected "above" or "below" the other element through an intermediate element.

It is to be noted that the steps illustrated in the flowcharts of the drawings may be performed in a computer system of such as a set of computer-executable instructions. In addition, although the logical order is shown in the flowchart, the order of the steps of the embodiments is not limited to the order in which they are arranged in the specification. In some cases, the implementation steps may also be adjusted according to specific requirements, and the steps shown or described are performed in an order than those described herein.

In an existing IBC solar cell, a passivation layer is generally deposited on a front surface of the solar cell. A passivation material in the passivation layer chemically reacts with a surface of the silicon substrate and bonds to reduce the density of defects on the front surface of the solar cell, so as to produce a chemical passivating effect on the front surface of the solar cell, thereby reducing a recombination rate of the front surface of the solar cell. The passivation layer is of limited use to improve the passivation effect on the front surface of the solar cell, and a large number of carriers are still recombined before reaching the back surface of the solar cell. Therefore, the passivation effect on the front surface of the solar cell is undesired, which may bring adverse effects to the conversion efficiency of the solar cell.

In order to improve the passivation effect on the front surface of the solar cell, in the existing IBC solar cell, firstly, a front surface field is formed on the front surface of the solar cell by doping, and the front surface field covers the front surface of the entire solar cell. Subsequently, a passivation layer is deposited on a surface of the front surface field. The front surface field drives photogenerated carriers away from the front surface of the solar cell through a Coulomb field generated by charged ions existing in the front surface field, so as to produce a field passivation effect on the front surface of the solar cell, which can more effectively reduce a recombination rate of the front surface of the solar cell in conjunction with the chemical passivating effect produced by the passivation layer. However, the front surface field covering the front surface of the entire solar cell may also affect the chemical passivating effect of the passivation layer, and recombination still exists on the front surface field. As a result, the front surface field has limited effect in improving the passivation effect on the front surface of the solar cell, and the conversion efficiency of the solar cell is not significantly improved.

Thus, in order to overcome the imperfection of the related art, according to some embodiments of the present disclosure, a solar cell and a manufacturing method thereof are provided so as to reduce the influence of a front surface field on a chemical passivating effect of a passivation layer while forming the front surface field on a front surface of the solar cell, which significantly improve a passivating effect on the front surface of the solar cell and more effectively improve the conversion efficiency of the solar cell.

According to some embodiments of the present disclosure, a method for manufacturing a solar cell is provided, including the following steps.

Forming, on a first surface of the silicon substrate, P-type conductive regions and N-type conductive regions that are alternately arranged.

Forming, on a second surface of the silicon substrate, front diffusion layers spaced from each other.

Forming at least one front passivation layer and/or anti-reflection layer on upper surfaces of the front diffusion layers by a passivation process at the second surface side of the silicon substrate.

Forming at least one back passivation layer on lower surfaces of the P-type conductive regions and the N-type conductive regions by a passivation process at the first surface side of the silicon substrate.

Forming metal electrodes by a metallization process at the first surface side of the silicon substrate.

It is to be understood that the silicon substrate includes a first surface and a second surface, and the first surface and the second surface are arranged opposite to each other.

The first surface may be a back surface of the silicon substrate, and the second surface may be a front surface of the silicon substrate. Alternatively, the first surface may be a front surface of the silicon substrate, and the second surface may be a back surface of the silicon substrate. In the following, the solar cell and the manufacturing method thereof are illustrated with an example in which the first surface is a back surface of the silicon substrate and the second surface is a front surface of the silicon substrate. However, it would be appreciated by those skilled in the art the principle of the present disclosure may be implemented in any properly arranged solar cell. In addition, any method or structure similar to or equal to the content described in the present disclosure may also be applied to the present disclosure.

In some embodiments, the front surface of the silicon substrate is a surface facing the sun (i.e., light receiving surface), and the back surface of the silicon substrate is a surface facing away from the sun (i.e., backlight surface).

In some embodiments, the silicon substrate may be a polycrystalline silicon substrate, a monocrystalline silicon substrate or a semi-monocrystalline silicon substrate. In addition, the silicon substrate may also be a P-type substrate or an N-type substrate. The specific type of the silicon substrate is not limited in embodiments of the present disclosure. Merely for illustration, the silicon substrate may be the N-type monocrystalline silicon substrate.

In some embodiments, the step of forming, on a back surface of the silicon substrate, P-type conductive regions and N-type conductive regions that are alternately arranged includes the following steps.

In S10, a dielectric layer is formed on the back surface of the silicon substrate.

In step S10, the dielectric layer may be a tunneling layer. The specific type of the dielectric layer is not limited herein, which may be selected and set by those skilled in the art according to an actual situation. In some embodiments, the dielectric layer may be any one or combinations of a silicon dioxide dielectric layer, a silicon nitride dielectric layer, an alumina dielectric layer or a hafnium oxide dielectric layer.

In some embodiments, the dielectric layer has a thickness ranging from 0.5 nm to 2 nm, which may be, for example, 0.5 nm, 1 nm, 1.5 nm or 2 nm. The dielectric layer not only passivates a surface of the silicon substrate, but also allows carriers to tunnel through. When the thickness of the dielectric layer is excessively small, no passivation effect may be achieved. When the thickness of the dielectric layer is excessively large, the carries cannot tunnel through effectively.

It is to be noted that the specific operation manner of forming the dielectric layer is not limited in embodiments of the present disclosure. In some embodiments, the step of forming a dielectric layer on the back surface of the silicon substrate includes: forming the dielectric layer on the back surface of the silicon substrate by any one or more of, for example, chemical vapor deposition, high-temperature thermal oxidation and nitric acid oxidation.

In S11, a polycrystalline silicon layer is formed on a lower surface of the dielectric layer.

In step S11, the polycrystalline silicon layer may be deposited on the lower surface of the dielectric layer by any one or more of chemical vapor deposition (CVD), physical vapor deposition (PVD) and atomic layer deposition (ALD).

The deposition may be performed by, for example, CVD, PVD or ALD, or further by plasma enhanced chemical vapor deposition (PECVD). In addition, the deposition may also be replaced with other similar deposition methods, which is not limited in embodiments of the present disclosure. Correspondingly, a device for deposition may be, for example, a PVD device, an ALD device or a PECVD device.

In some embodiments, the polycrystalline silicon layer has a thickness ranging from 10 nm to 100 nm, which may be, for example, 10 nm, 20 nm, 30 nm, 40 nm, 50 nm, 60 nm, 70 nm, 80 nm, 90 nm or 100 nm. The thickness of the polycrystalline silicon layer is controlled within the above range, so that the solar cell has higher conversion efficiency. When the thickness of the polycrystalline silicon layer is excessively large, the polycrystalline silicon layer may have a serious problem of light absorption, so that light energy cannot be fully converted into electric energy, thereby bringing adverse effects to the conversion efficiency of the solar cell. When the thickness of the polycrystalline silicon layer is excessively small, during subsequent forming of the metal electrode on the back surface of the silicon substrate, printed metal paste may fire through the polycrystalline silicon layer, so that the metal electrode directly contacts the dielectric layer or the silicon substrate, resulting in a serious problem of metal recombination, thereby bringing adverse effects to the conversion efficiency of the solar cell.

In some embodiments, the polycrystalline silicon layer formed on the lower surface of the dielectric layer is an undoped polycrystalline silicon layer (e.g., an intrinsic polycrystalline silicon layer) or formed by an undoped amorphous silicon layer (e.g., an intrinsic amorphous silicon layer) by high-temperature annealing.

In S12, first regions and second regions of the polycrystalline silicon layer are doped respectively. The first regions and the second regions are alternately arranged.

In some embodiments, the first regions and the second regions of the polycrystalline silicon layer are doped by any one or more of chemical vapor deposition, spin coating (plating), screen printing and inkjet.

In step S12, doping sources in the first regions and the second regions have different polarities. Specific types of the doping sources in the first regions and the second regions are not limited, provided that first doped polycrystalline silicon layers and second doped polycrystalline silicon layers formed have different polarities. For example, the first regions may be doped with phosphorus or arsenic, and the second regions may be doped with boron or gallium. Alternatively, the first regions may be doped with boron or gallium, and the second regions may be doped with phosphorus or arsenic.

For example, if the first regions are doped with boron or gallium, the first doped polycrystalline silicon layers formed correspondingly are P-type polycrystalline silicon layers. If the second regions are doped with phosphorus or arsenic, the second doped polycrystalline silicon layers formed correspondingly are N-type polycrystalline silicon layers. Alternatively, if the first regions are doped with phosphorus or arsenic, the first doped polycrystalline silicon layers formed correspondingly are N-type polycrystalline silicon layers. If the second regions are doped with boron or gallium, the second doped polycrystalline silicon layers formed correspondingly are P-type polycrystalline silicon layers.

The P-type polycrystalline silicon layers have a sheet resistance ranging from 150 Ω/sqr to 450 Ω/sqr, which may further range from 200 Ω/sqr to 400 Ω/sqr, and may be, for example, 150 Ω/sqr, 200 Ω/sqr, 250 Ω/sqr, 300 Ω/sqr, 350 Ω/sqr, 400 Ω/sqr or 450 Ω/sqr. The N-type polycrystalline silicon layers have a sheet resistance ranging from 40 Ω/sqr to 200 Ω/sqr, which may further range from 70 Ω/sqr to 160 Ω/sqr, and may be, for example, 40 Ω/sqr, 60 Ω/sqr, 80 Ω/sqr, 100 Ω/sqr, 120 Ω/sqr, 140 Ω/sqr, 160 Ω/sqr, 180 Ω/sqr or 200 Ω/sqr.

When the first regions and the second regions of the polycrystalline silicon layer are doped, specific doping concentrations may be regulated according to ranges of sheet resistances of the regions, which are not described in detail herein.

In the above suitable ranges of diffusion sheet resistance or diffusion concentration of the P-type polycrystalline silicon layers, diffusion sheet resistance or diffusion concentration of the N-type polycrystalline silicon layers and the thickness of the polycrystalline silicon layer, it is helpful to improve photoelectric conversion efficiency of the solar cell and improve the performance of the solar cell.

In some embodiments, the first regions and the second regions of the polycrystalline silicon layer are local regions of the polycrystalline silicon layer, and the first regions and the second regions do not constitute the whole region of the polycrystalline silicon layer. Spacing regions are required to be provided between the first regions and the second regions. That is, the spacing regions may be a part of the polycrystalline silicon layer, so that the spacing regions exist between the first doped polycrystalline silicon layers formed corresponding to the first regions and the second doped polycrystalline silicon layers formed corresponding to the second regions. The spacing regions can play a role of insulation, thereby preventing the formation of a short circuit caused by connections between the first doped polycrystalline silicon layers and the second doped polycrystalline silicon layers.

For example, unprinted doping sources, e.g., undoped intrinsic polycrystalline silicon layer regions, may be retained between the first regions and the second regions. The intrinsic polycrystalline silicon layer regions may insulate the first doped polycrystalline silicon layers formed corresponding to the first regions from the second doped polycrystalline silicon layers formed corresponding to the second regions, so as to prevent short circuit of the solar cell.

In some embodiments, spacing regions exist between at least part of the first regions and the second regions. The spacing regions have a width ranging from 20 μm to 150 μm, which may further range from 30 μm to 110 μm, and may be, for example, 20 μm, 30 μm, 40 μm, 50 μm, 60 μm, 70 μm, 80 μm, 90 μm, 100 μm, 110 μm, 120 μm, 130 μm, 140 μm or 150 μm. The width of the spacing regions is controlled within the above range, which can effectively isolate the first doped polycrystalline silicon layers formed corresponding to the first regions from the second doped polycrystalline silicon layers formed corresponding to the second regions, thereby preventing recombination of the carriers and short circuit of the solar cell caused by direct contact therebetween.

In S13, the back surface of the silicon substrate is annealed, upon completion of annealing, first doped polycrystalline silicon layers and second doped polycrystalline silicon layers that are alternately arranged are formed on the back surface of the silicon substrate, and the first doped polycrystalline silicon layers and the second doped polycrystalline silicon layers have different polarities.

In some embodiments, after high-temperature annealing, the intrinsic polycrystalline silicon layer regions may also be etched by one or more of, for example, dry etching, wet etching and laser etching, to form a groove structure for insulating the first doped polycrystalline silicon layers from the second doped polycrystalline silicon layers, thereby preventing short circuit of the solar cell.

In some embodiments, the step of forming, on a back surface of the silicon substrate, P-type conductive regions and N-type conductive regions alternately arranged includes the following steps.

In S20, first doped regions and second doped regions on the back surface of the silicon substrate are doped, respectively. The first doped regions and the second doped regions are alternately arranged.

In some embodiments, the first doped regions and the second doped regions on the back surface of the silicon substrate are doped by any one or more of chemical vapor deposition, spin coating (plating), screen printing and inkjet.

In step S20, doping sources in the first doped regions and the second doped regions have different polarities. Specific types of the doping sources in the first doped regions and the second doped regions are not limited. For example, the first doped regions may be doped with phosphorus or arsenic, and the second doped regions may be doped with boron or gallium. Alternatively, the first doped regions may be doped with boron or gallium, and the second doped regions may be doped with phosphorus or arsenic.

For example, if the first doped regions are doped with boron or gallium, P-type doped regions are formed correspondingly. If the second doped regions are doped with phosphorus or arsenic, N-type doped regions are formed correspondingly. Alternatively, if the first doped regions are doped with phosphorus or arsenic, N-type doped regions are formed correspondingly. If the second doped regions are doped with boron or gallium, P-type doped regions are formed correspondingly.

The P-type doped regions have a sheet resistance ranging from 150 Ω/sqr to 450 Ω/sqr, which may further range from 200 Ω/sqr to 400 Ω/sqr, and may be, for example, 150 Ω/sqr, 200 Ω/sqr, 250 Ω/sqr, 300 Ω/sqr, 350 Ω/sqr, 400 Ω/sqr or 450 Ω/sqr. The N-type doped regions have a sheet resistance ranging from 40 Ω/sqr to 200 Ω/sqr, which may further range from 70 Ω/sqr to 160 Ω/sqr, and may be, for example, 40 Ω/sqr, 60 Ω/sqr, 80 Ω/sqr, 100 Ω/sqr, 120 Ω/sqr, 140 Ω/sqr, 160 Ω/sqr, 180 Ω/sqr or 200 Ω/sqr.

When the first doped regions and the second doped regions on the back surface of the silicon substrate are doped, specific doping concentrations may be regulated according to ranges of sheet resistances of the regions, which are not described in detail herein.

In the above suitable ranges of diffusion sheet resistance or diffusion concentration of the P-type doped regions and diffusion sheet resistance or diffusion concentration of the N-type doped regions, it is helpful to improve photoelectric conversion efficiency of the solar cell and improve the performance of the solar cell.

In some embodiments, the first doped regions and the second doped regions on the back surface of the silicon substrate are local regions of the back surface of the silicon substrate, and the first doped regions and the second doped regions do not constitute the whole region of the back surface of the silicon substrate. Spacing regions are required to be provided between the first doped regions and the second doped regions. That is, the spacing regions may be a part of the silicon substrate, so that the spacing regions exist between the P-type doped regions and the N-type doped regions. The spacing regions can play a role of insulation, thereby preventing the formation of a short circuit caused by connection between the P-type doped regions and the N-type doped regions.

Ranges of the widths of the spacing regions are the same as those in the above embodiment, and are not described in detail herein.

In S21, the back surface of the silicon substrate is annealed, and upon completion of annealing, P-type doped regions and N-type doped regions that are alternately f on the back surface of the silicon substrate.

In some embodiments, after high-temperature annealing, the spacing regions between the P-type doped regions and the N-type doped regions may also be etched by one or more of, for example, dry etching, wet etching and laser etching, to form a groove structure for insulating the P-type doped regions from the N-type doped regions, thereby preventing short circuit of the solar cell.

In some embodiments, the step of forming, on a front surface of the silicon substrate, front diffusion layers spaced from each other includes the following steps.

In S30, the silicon substrate is textured.

In step S30, the silicon substrate may be a P-type substrate or an N-type substrate. For example, the front surface of the P-type substrate may be textured to form a textured structure. As another example, the front surface of the N-type substrate may be textured to form a textured structure.

It is to be noted that the specific operation manner of texturing is not limited in embodiments of the present disclosure. For example, the P-type substrate or the N-type substrate may be textured by, but not limited to, a wet texturing process. The P-type substrate or the N-type substrate is textured using an alkaline solution such as a potassium hydroxide solution in the case of a monocrystalline silicon substrate. The P-type substrate or the N-type substrate is textured using an acidic solution such as a hydrofluoric acid solution in the case of a polycrystalline silicon substrate. In addition, a small amount of texturing additives may also be added to the acidic solution or the alkaline solution.

In some embodiments of the present disclosure, the surface of the silicon substrate has a textured structure by texturing, which produces a light trap effect and increases an amount of light absorbed by the solar cell, thereby improving the conversion efficiency of the solar cell.

In some embodiments, prior to the texturing, a step of cleaning the silicon substrate may also be performed, so as to remove metal and organic contaminants from the surface.

In S31, third regions on the front surface of the silicon substrate are doped. The third regions are spaced from each other.

In step S31, a specific type of a doping source doped on the front surface of the silicon substrate is not limited, either, which may be, for example, phosphorus- or arsenic-doped, or boron- or gallium-doped, to form a front surface field (FSF). For example, when the silicon substrate is the P-type substrate, the third regions on the front surface of the silicon substrate are doped with boron or gallium. Alternatively, when the silicon substrate is the N-type substrate, the third regions on the front surface of the silicon substrate are doped with phosphorus or arsenic.

In some embodiments, the third regions are in one-to-one correspondence to the first regions. That is, positions of the third regions on the front surface of the silicon substrate may be in one-to-one correspondence to positions of the first regions on the back surface of the silicon substrate. Alternatively, the third regions are in one-to-one correspondence to the second regions. That is, positions of the third regions on the front surface of the silicon substrate may be in one-to-one correspondence to positions of the second regions on the back surface of the silicon substrate. For example, the one-to-one correspondence refers to that each of the third regions is corresponding to one of the first regions or one of the second regions.

For example, when the silicon substrate is the P-type substrate, N-type polycrystalline silicon layers or N-type doped regions are formed corresponding to the first regions, and P-type polycrystalline silicon layers or P-type doped regions are formed corresponding to the second regions, the third regions are in one-to-one correspondence to the second regions. Alternatively, when the silicon substrate is the N-type substrate, P-type polycrystalline silicon layers or P-type doped regions are formed corresponding to the first regions, and N-type polycrystalline silicon layers or N-type doped regions are formed corresponding to the second regions, the third regions are in one-to-one correspondence to the second regions.

In some embodiments, when the third regions are in one-to-one correspondence to the first regions, orthographic projections of the first regions perpendicular to the front surface of the silicon substrate are within orthographic projections of the third regions perpendicular to the front surface of the silicon substrate. Alternatively, when the third regions are in one-to-one correspondence to the second regions, orthographic projections of the second regions perpendicular to the front surface of the silicon substrate are within orthographic projections of the third regions perpendicular to the front surface of the silicon substrate.

In some embodiments, the front surface field has a width ranging from 200 μm to 600 μm, which may be, for example, 200 μm, 250 μm, 300 μm, 350 μm, 400 μm, 450 μm, 500 μm, 550 μm or 600 μm. When the width of the front surface field is controlled within the above range, the orthographic projections of the first regions or the second regions perpendicular to the front surface of the silicon substrate are completely on the orthographic projections of the third regions perpendicular to the front surface of the silicon substrate, so that the front surface of the silicon substrate has an excellent field passivation effect.

In some embodiments, when the third regions are in one-to-one correspondence to the first regions or the second regions, orthographic projections of the spacing regions perpendicular to the front surface of the silicon substrate may also be within the orthographic projections of the third regions perpendicular to the front surface of the silicon substrate.

In some embodiments, the width of the front surface field is 0 μm to 50 μm longer than a total width of the first region and two spacing regions adjacent thereto or a total width of the second region and two spacing regions adjacent thereto, which may be, for example, 0 µm, 10 µm, 20 µm, 30 µm, 40 µm or 50 µm. That is, when the third regions are in one-to-one correspondence to the first regions, at least part of orthographic projections of the second regions perpendicular to the front surface of the silicon substrate may also be within the orthographic projections of the third regions perpendicular to the front surface of the silicon substrate. Alternatively, when the third regions are in one-to-one correspondence to the second regions, at least part of orthographic projections of the second regions perpendicular to the front surface of the silicon substrate may also be within the orthographic projections of the third regions perpendicular to the front surface of the silicon substrate, so that the front surface of the silicon substrate has an excellent field passivation effect.

In some embodiments, the front surface field has a doping concentration ranging from 5E18 $cm^{-3}$ to 5E19 $cm^{-3}$, which may be, for example, 5E18 $cm^{-3}$, 6E18 $cm^{-3}$, 7E18 $cm^{-3}$, 8E18 $cm^{-3}$, 9E18 $cm^{-3}$, 1E19 $cm^{-3}$, 2E19 $cm^{-3}$, 3E19 $cm^{-3}$, 4E19 $cm^{-3}$ or 5E19 $cm^{-3}$. The doping concentration of the third region is controlled within the above range, so that the front surface of the silicon substrate has excellent field passivation effect.

In some embodiments, the front surface field has a sheet resistance ranging from 300 Ω/sqr to 1300 Ω/sqr, which may further range from 500 Ω/sqr to 1000 Ω/sqr, and may be, for example, 300 Ω/sqr, 400 Ω/sqr, 500 Ω/sqr, 600 Ω/sqr, 700 Ω/sqr, 800 Ω/sqr, 900 Ω/sqr, 1000 Ω/sqr, 1100 Ω/sqr, 1200 Ω/sqr or 1300 Ω/sqr. The sheet resistance of the front surface field is controlled within the above range, which is conducive to improving the passivation effect on the front surface field, thereby improving the passivation effect on the front surface of the silicon substrate.

In some embodiments, the front surface field has a doping junction depth ranging from 20 nm to 150 nm, which may be, for example, 20 nm, 30 nm, 40 nm, 50 nm 60 nm, 70 nm, 80 nm, 90 nm, 100 nm, 110 nm, 120 nm, 130 nm, 140 nm or 150 nm. The doping junction depth of the front surface field is controlled within the above range, so that the front surface of the silicon substrate has excellent field passivation effect.

In some embodiments, a total area of all the front surface fields (i.e., areas of all the third regions) accounts for 45% to 60% of an area of the front surface of the silicon substrate, which may be, for example, 45%, 50%, 55% or 60%. An area ratio of all the front surface fields is controlled within the above range, so that the front surface of the silicon substrate has an excellent field passivation effect, and at the same time, may minimum the influence of the front surface fields on the chemical passivation effect of the front passivation layer subsequently formed on the front surface of the silicon substrate, thereby significantly improving the passivation effect on the front surface of the silicon substrate.

In S32, the front surface of the silicon substrate is annealed, and upon completion of annealing, front diffusion layers (i.e., front surface fields) that are alternately arranged are formed on the front surface of the silicon substrate.

It may be understood that the front surface and the back surface of the silicon substrate may be annealed separately or annealed in one step at the same time. Through the annealing in one step, additional process steps involved in the existing process may be omitted, which prevents multiple or multi-step high-temperature processes, saves costs, reduces the complexity of the technological process of the solar cell, and has a simple manufacturing process, relatively low investment costs and greater market competitiveness.

In some embodiments, subsequent to the step of annealing the front surface and/or the back surface of the silicon substrate, a step of cleaning the silicon substrate may also be included. For example, the silicon substrate may be cleaned using hydrofluoric acid or a mixture of hydrochloric acid and hydrogen peroxide, so as to remove residual or excess doping sources, and surface cleaning is performed, so as to reduce impurities and improve conversion efficiency. A specific operation manner or requirements of cleaning re not limited in the present disclosure, which may be selected according to an actual operation.

In some embodiments, the front surface of the silicon substrate is passivated, so as to form at least one front passivation layer and/or antireflection layer on upper surfaces of the front diffusion layers. For example, at least one front passivation layer or antireflection layer may be formed, or at least one front passivation layer and antireflection layer are formed.

In some embodiments, the at least one front passivation layer and/or the at least one antireflection layer may be deposited by plasma-enhanced chemical vapor deposition. It is appreciated that, other methods such as organic chemical vapor deposition may also be used. A specific implementation of front surface passivation is not limited in embodiments of the present disclosure.

Specific materials of the at least one front passivation layer and/or the at least one antireflection layer are not limited in embodiments of the present disclosure. In some embodiments, when the front diffusion layer is a P-type diffusion layer, an alumina/silicon nitride stack structure may be used as the front passivation layer. At the same time, the stack structure may also be an antireflection layer. Alternatively, the front passivation layer and the antireflection layer may be made of silicon oxynitride, but are not limited thereto. For example, the front passivation layer may be of a stack structure made of one or more of silicon oxide, silicon oxynitride, silicon carbide, alumina, a silicon nitride layer, silicon dioxide, silicon nitride and gallium oxide, and the antireflection layer may be a silicon nitride layer.

When the front diffusion layer is an N-type diffusion layer, an oxide layer (with a thickness ranging from 1 nm to 5 nm) may be superimposed onto a silicon nitride layer deposited by a PECVD process to act as the front passivation layer. The silicon nitride layer may also be the antireflection layer.

A stack formed by the front passivation layer and the antireflection layer has a good passivation effect, which can improve the photoelectric conversion efficiency of the solar cell. In addition, the antireflection layer is arranged to reduce light reflection and increase an amount of light absorbed by the solar cell on the one hand, and to produce a passivation effect on the other hand, thereby improving the conversion efficiency of the solar cell.

In some embodiments, the back surface of the silicon substrate is passivated, so as to form at least one back passivation layer on lower surfaces of the P-type conductive regions and the N-type conductive regions. In some embodiments, the back passivation layer(s) can be formed on lower surfaces of the P-type polycrystalline silicon layers, the N-type polycrystalline silicon layers and the spacing regions or on lower surfaces of the P-type doped regions, the N-type doped regions and the spacing regions.

In some embodiments, the at least one back passivation layer may be deposited by plasma-enhanced chemical vapor deposition. It is appreciated that, other methods such as organic chemical vapor deposition may also be used. A specific implementation of the back passivation layer is not limited in embodiments of the present disclosure.

In some embodiments, the back passivation layer includes any one or combinations of a silicon nitride layer, a silicon oxynitride layer and an alumina/silicon nitride stack structure. It is appreciated that, the back passivation layer may also be other types of passivation layers, a specific material of which is not limited in the present disclosure. For example, in other embodiments, the back passivation layer may also be, for example, a stack of silicon dioxide and silicon nitride. The back passivation layer can produce a good passivation effect on the silicon substrate, which helps to improve the conversion efficiency of the solar cell.

In some embodiments, the thickness of the front passivation layer, the antireflection layer or the back passivation layer is not limited in embodiments of the present disclosure, which may be adjusted by those skilled in the art according to an actual situation. In some embodiments, the thickness of the front passivation layer may range from 3 nm to 30 nm, which may be, for example, 3 nm, 5 nm, 10 nm, 15 nm, 20 nm, 25 nm or 30 nm. The thickness of the antireflection layer may range from 40 nm to 100 nm, and may further range from 60 nm to 90 nm, which may be, for example, 60 nm, 65 nm, 70 nm, 75 nm, 80 nm, 85 nm or 90 nm. The thickness of the back passivation layer may range from 40 nm to 100 nm, and may further range from 50 nm to 80 nm, which may be, for example, 40 nm, 50 nm, 60 nm, 70 nm, 80 nm, 90 nm or 100 nm.

In some embodiments, the back surface of the silicon substrate is metalized to form metal electrodes. In some embodiments, the metal electrodes are formed on lower surfaces of the at least one back passivation layer.

In some embodiments, the metal electrodes includes first electrodes and second electrodes. The first electrodes and the second electrodes correspond to the first regions and the second regions of different polarities, respectively. The first electrodes and the second electrodes may be fabricated by screen printing and sintered, to enable the first electrodes to pass through the at least one back passivation layer to form ohmic contact with the N-type polycrystalline silicon layers or the N-type doped regions and the second electrodes to pass through the at least one back passivation layer to form ohmic contact with the P-type polycrystalline silicon layers or the P-type doped regions. Alternatively, The first electrodes and the second electrodes may be fabricated by screen printing and sintered, to enable the first electrodes to pass through the at least one back passivation layer to form ohmic contact with the P-type polycrystalline silicon layers or the P-type doped regions and the second electrodes to pass through the at least one back passivation layer to form ohmic contact with the N-type polycrystalline silicon layers or the N-type doped regions.

In some embodiments, specific materials of the first electrodes and the second electrodes are not limited in embodiments of the present disclosure. In some embodiments, when the first electrodes form ohmic contact with the P-type polycrystalline silicon layers or the P-type doped regions and the second electrodes form ohmic contact with the N-type polycrystalline silicon layers or the N-type doped regions, the first electrodes are silver electrodes or silver/aluminum electrodes, and the second electrodes are silver electrodes. For example, silver paste may be printed on the lower surfaces of the at least one back passivation layer corresponding to the P-type polycrystalline silicon layers, and silver paste or silver paste doped with a small amount of aluminum, that is, silver/aluminum paste, may be printed on the lower surfaces of the at least one back passivation layer corresponding to the N-type polycrystalline silicon layers and sintered. The paste may fire through the at least one back passivation layer, formed silver electrodes or silver/aluminum electrodes form ohmic contact with the P-type polycrystalline silicon layers or the P-type doped regions, and the formed electrodes form ohmic contact with the N-type polycrystalline silicon layers or the N-type doped regions.

It is to be noted that, in the present disclosure, various operation steps may or may not be performed sequentially unless otherwise specified. The order of the steps of manufacturing the solar cell is not limited in embodiments of the present disclosure, which may be adjusted according to an actual manufacturing process.

In a second aspect, according to some embodiments of the present disclosure, a solar cell is further provided. The solar cell may be manufactured with the method for manufacturing a solar cell described above in the present disclosure.

The solar cell according to embodiments of the present disclosure based on a same invention concept as the method for manufacturing a solar cell described above, and thus has at least all the features and advantages of the method for manufacturing a solar cell described above, which are not described in detail herein.

In some embodiments, the solar cell may be a P-type IBC solar cell or an N-type IBC solar cell.

It is to be understood that, as described above, the silicon substrate includes a first surface and a second surface, and the first surface and the second surface are arranged opposite to each other. The first surface may be a back surface of the silicon substrate, and the second surface may be a front surface of the silicon substrate. Alternatively, the first surface may be a front surface of the silicon substrate, and the second surface may be a back surface of the silicon substrate. In some embodiments, the solar cell is illustrated below mainly with an example in which the first surface is a back surface (i.e., a surface facing away from the sun) of the silicon substrate and the second surface is a front surface (i.e., a surface facing the sun) of the silicon substrate, but is not limited thereto.

In some embodiments, the solar cell includes a silicon substrate, and the silicon substrate includes a front surface and a back surface arranged opposite to each other. P-type conductive regions and N-type conductive regions are located on the back surface of the silicon substrate and alternately arranged. Front surface field regions are located on the front surface of the silicon substrate and spaced from each other. The front surface field regions are in one-to-one correspondence to the P-type conductive regions or the N-type conductive regions. At least one front passivation layer is located on the front surface of the silicon substrate, and at least one back passivation layer is located on surfaces of the P-type conductive regions and the N-type conductive regions. For example, the one-to-one correspondence refers to that each of the front surface field regions is corresponding to one of the P-type conductive regions or the N-type conductive regions.

Referring to FIG. 1, in some embodiments, a solar cell 100 includes a silicon substrate 1, and the silicon substrate 1 includes a front surface and a back surface arranged opposite to each other. Dielectric layers 5 are located on the back surface of the silicon substrate 1. Polycrystalline silicon layers 9 are located on lower surfaces of the dielectric layers 5. First doped polycrystalline silicon layers 61*a* and second doped polycrystalline silicon layers 71*a* are alternately arranged and located on the lower surfaces of the dielectric layers 5. The first doped polycrystalline silicon layers 61a and the second doped polycrystalline silicon layers 71a have different polarities. The polycrystalline silicon layers 9, i.e., intrinsic polycrystalline silicon layers 9, are located between the first doped polycrystalline silicon layers 61a and the second doped polycrystalline silicon layers 71a. The first doped polycrystalline silicon layers 61a and the second doped polycrystalline silicon layers 71a have different polarities, so that P-type conductive regions 6 and N-type conductive regions 7 that are alternately arranged are formed on the back surface of the silicon substrate 1. At least one back passivation layer 8 is located on lower surfaces of the polycrystalline silicon layers 9, the first doped polycrystalline silicon layers 61a and the second doped polycrystalline silicon layers 71a. At least one front diffusion layer 2 is spaced from each other and located on the front surface of the silicon substrate 1, so as to form front surface field regions spaced from each other. The front diffusion layers 2 are in one-to-one correspondence to the first doped polycrystalline silicon layers 61a or the second doped polycrystalline silicon layers 71a. For example, the one-to-one correspondence refers to that each of the front diffusion layers is corresponding to one of the first doped polycrystalline silicon layers or the second doped polycrystalline silicon layers. At least one front passivation layer 3 and/or at least one antireflection layer 4 are located on upper surfaces of the front diffusion layers 2. First electrodes 62 and second electrodes 72 are located on lower surfaces of the at least one back passivation layer 8. The first electrodes 62 pass through the at least one back passivation layer 8 to form ohmic contact with the first doped polycrystalline silicon layers 61a, and the second electrodes 72 pass through the at least one back passivation layer 8 to form ohmic contact with the second doped polycrystalline silicon layers 71a.

The silicon substrate 1 may be a P-type substrate or an N-type substrate. The first doped polycrystalline silicon layers 61a may be P-type polycrystalline silicon layers 9 to form the P-type conductive regions 6 correspondingly. The second doped polycrystalline silicon layers 71a may be N-type polycrystalline silicon layers 9 to form the N-type conductive regions 7 correspondingly. Alternatively, the first doped polycrystalline silicon layers 61a may be N-type polycrystalline silicon layers 9 to form the N-type conductive regions 7 correspondingly. The second doped polycrystalline silicon layers 71a may be P-type polycrystalline silicon layers 9 to form the P-type conductive regions 6 correspondingly.

Figure 2:
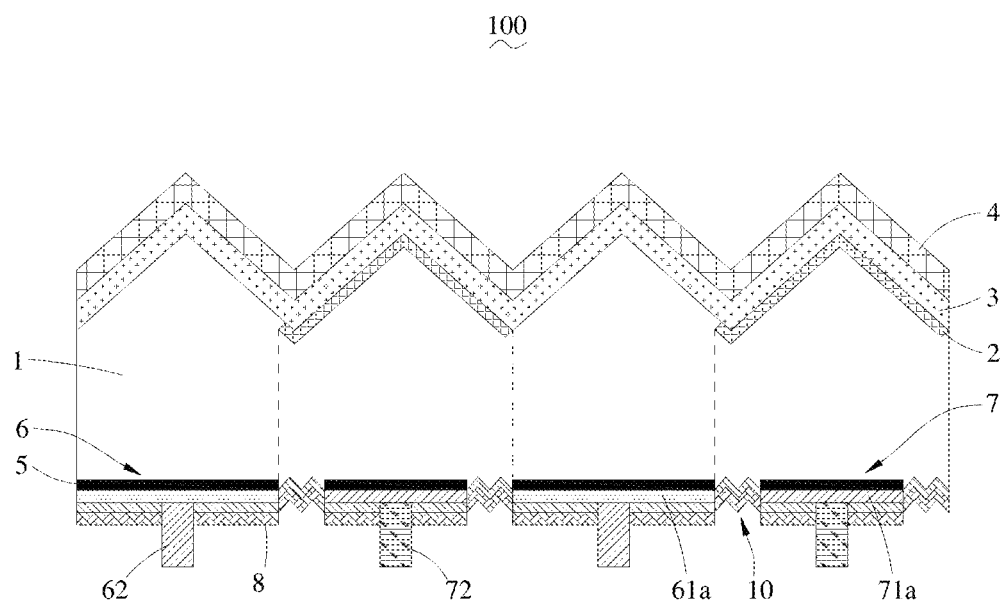
FIG. 2 is a second schematic structural diagram of a solar cell according to some embodiments of the present disclosure.
Figure 3:
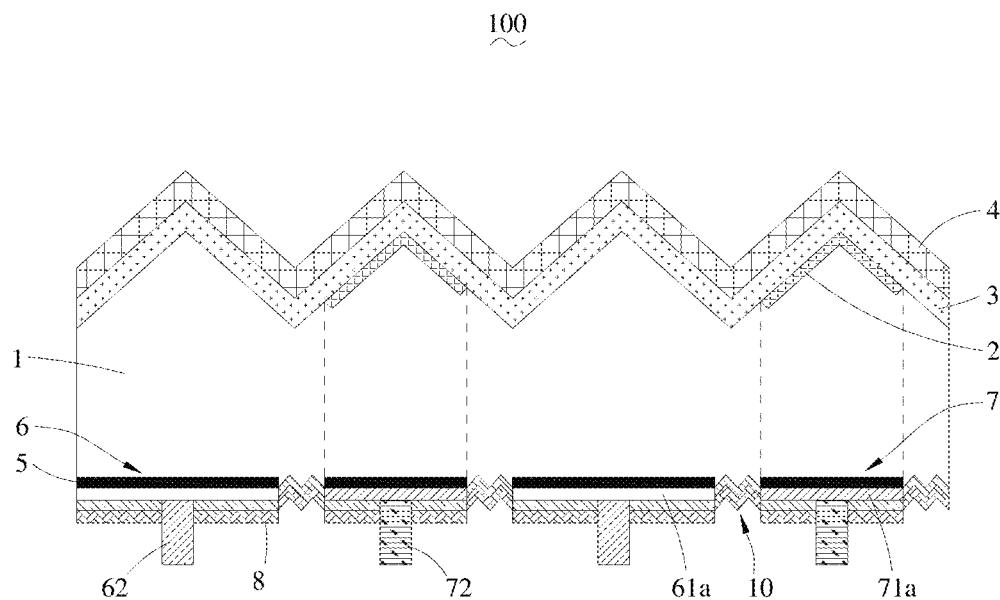
FIG. 3 is a third schematic structural diagram of a solar cell according to some embodiments of the present disclosure.
Figure 4:
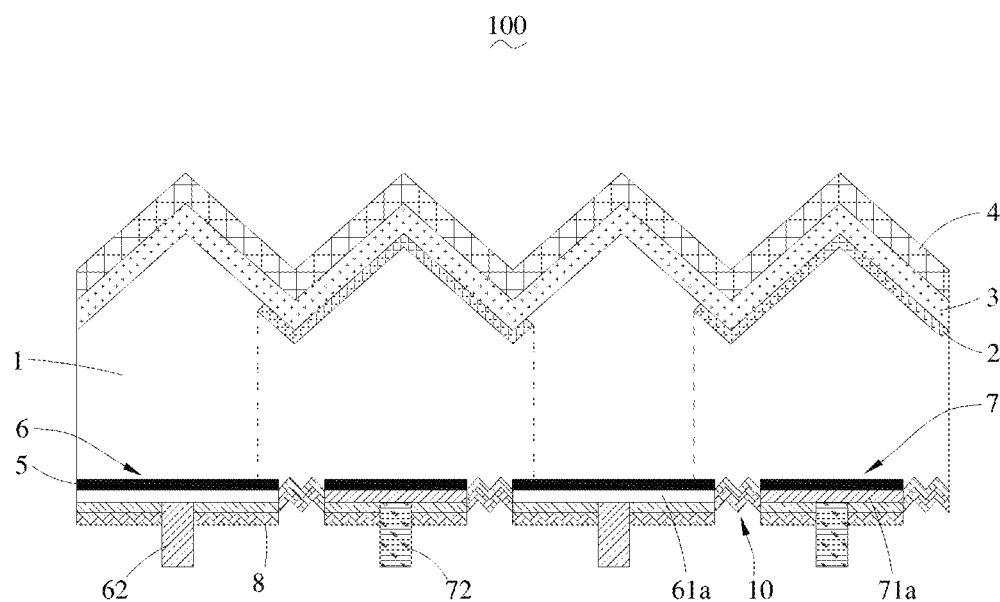
FIG. 4 is a fourth schematic structural diagram of a solar cell according to some embodiments of the present disclosure.

In some embodiments, referring to FIG. 2 to FIG. 4, when the front diffusion layers 2 are in one-to-one correspondence to the second doped polycrystalline silicon layers 71a, orthographic projections of the second doped polycrystalline silicon layers 71a perpendicular to the front surface of the silicon substrate 1 are within orthographic projections of the front diffusion layers 2 perpendicular to the front surface of the silicon substrate 1.

For example, when the silicon substrate 1 is a P-type substrate, the first doped polycrystalline silicon layers 61a are N-type polycrystalline silicon layers 9, the second doped polycrystalline silicon layers 71a are P-type polycrystalline silicon layers 9, and the front diffusion layers 2 are in one-to-one correspondence to the second doped polycrystalline silicon layers 71a. That is, the front surface field regions are in one-to-one correspondence to the P-type conductive regions 6, and orthographic projections of the P-type conductive regions 6 perpendicular to the front surface of the silicon substrate 1 are within orthographic projections of the front surface field regions perpendicular to the front surface of the silicon substrate 1.

When the silicon substrate 1 is an N-type substrate, the first doped polycrystalline silicon layers 61a are P-type polycrystalline silicon layers 9, the second doped polycrystalline silicon layers 71a are N-type polycrystalline silicon layers 9, and the front diffusion layers 2 are in one-to-one correspondence to the second doped polycrystalline silicon layers 71a. That is, the front surface field regions are in one-to-one correspondence to the N-type conductive regions 7, and orthographic projections of the N-type conductive regions 7 perpendicular to the front surface of the silicon substrate 1 are within orthographic projections of the front surface field regions perpendicular to the front surface of the silicon substrate 1.

According to the related description about the method for manufacturing the solar cell 100, after high-temperature annealing, the polycrystalline silicon layers 9 may also be etched by one or more of, for example, dry etching, wet etching and laser etching, to form a groove structure for insulating the first doped polycrystalline silicon layers 61a from the second doped polycrystalline silicon layers 71a, so as to form spacing regions 10 between the P-type conductive regions 6 and the N-type conductive regions 7, thereby preventing short circuit of the solar cell.

In some embodiments, still referring to FIG. 2, at least part of orthographic projections of the spacing regions 10 perpendicular to the front surface of the silicon substrate 1 may also be within the orthographic projections of the front diffusion layers 2 perpendicular to the front surface of the silicon substrate 1.

In some embodiments, still referring to FIG. 3, orthographic projections of the spacing regions 10 perpendicular to the front surface of the silicon substrate 1 do not overlap orthographic projections of the front diffusion layers 2 perpendicular to the front surface of the silicon substrate 1.

In some embodiments, still referring to FIG. 4, orthographic projections of the spacing regions 10 perpendicular to the front surface of the silicon substrate 1 are within the orthographic projections of the front diffusion layers 2 perpendicular to the front surface of the silicon substrate 1. At least part of orthographic projections of the first doped polycrystalline silicon layers 61a perpendicular to the front surface of the silicon substrate 1 may also be within the orthographic projections of the front diffusion layers 2 perpendicular to the front surface of the silicon substrate 1.

For example, when the silicon substrate 1 is a P-type substrate, the first doped polycrystalline silicon layers 61a are N-type polycrystalline silicon layers 9, and the second doped polycrystalline silicon layers 71a are P-type polycrystalline silicon layers 9. At least part of orthographic projections of the N-type polycrystalline silicon layers 9 perpendicular to the front surface of the silicon substrate 1 are within the orthographic projections of the front diffusion layers 2 perpendicular to the front surface of the silicon substrate 1. That is, at least part of orthographic projections of the N-type conductive regions 7 perpendicular to the front surface of the silicon substrate 1 are within the orthographic projections of the front surface field regions perpendicular to the front surface of the silicon substrate 1.

For example, when the silicon substrate 1 is an N-type substrate, the first doped polycrystalline silicon layers 61a are P-type polycrystalline silicon layers 9, and the second doped polycrystalline silicon layers 71a are N-type polycrystalline silicon layers 9. At least part of orthographic projections of the P-type polycrystalline silicon layers 9 perpendicular to the front surface of the silicon substrate 1 are within the orthographic projections of the front diffusion layers 2 perpendicular to the front surface of the silicon substrate 1. That is, at least part of orthographic projections of the P-type conductive regions 6 perpendicular to the front surface of the silicon substrate 1 are within the orthographic projections of the front surface field regions perpendicular to the front surface of the silicon substrate 1.

Figure 5:
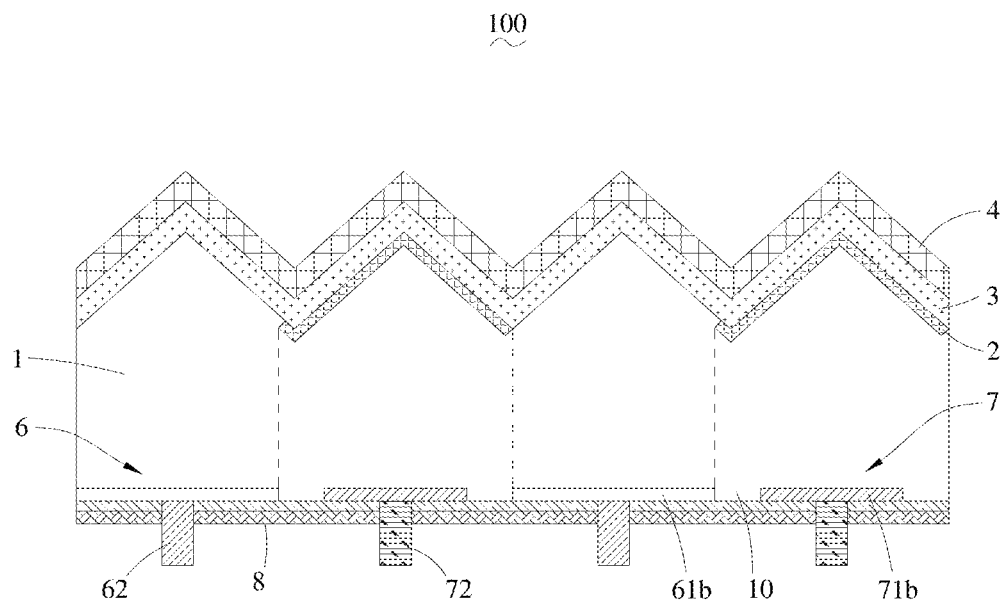
FIG. 5 is a fifth schematic structural diagram of a solar cell according to some embodiments of the present disclosure.

Referring to FIG. 5, in some other embodiments, a solar cell 100 includes a silicon substrate 1, and the silicon substrate 1 includes a front surface and a back surface arranged opposite to each other. First doped regions 61b and second doped regions 71b are alternately arranged and located on the back surface of the silicon substrate 1. The first doped regions 61b and the second doped regions 71b have different polarities, so that P-type conductive regions 6 and N-type conductive regions 7 that are alternately arranged are formed on the back surface of the silicon substrate 1. At least one back passivation layer 8 is located on the back surface of the silicon substrate 1. At least one front diffusion layer 2 is spaced from each other and located on the front surface of the silicon substrate 1, so as to form front surface field regions spaced from each other. The front diffusion layers 2 are in one-to-one correspondence to the first doped regions 61b or the second doped regions 71b. At least one front passivation layer 3 and/or at least one antireflection layer 4 are located on upper surfaces of the front diffusion layers 2. First electrodes 62 and second electrodes 72 are located on lower surfaces of the at least one back passivation layer 8. The first electrodes 62 pass through the at least one back passivation layer 8 to form ohmic contact with the first doped regions 61b, and the second electrodes 72 pass through the at least one back passivation layer 8 to form ohmic contact with the second doped regions 71b.

The silicon substrate 1 may be a P-type substrate or an N-type substrate. The first doped regions 61b may be P-type doped regions to form the P-type conductive regions 6 correspondingly. The second doped regions 71b may be N-type doped regions to form the N-type conductive regions 7 correspondingly. Alternatively, the first doped regions 61b may be N-type doped regions to form the N-type conductive regions 7 correspondingly. The second doped regions 71b may be P-type doped regions to form the P-type conductive regions 6 correspondingly.

Figure 6:
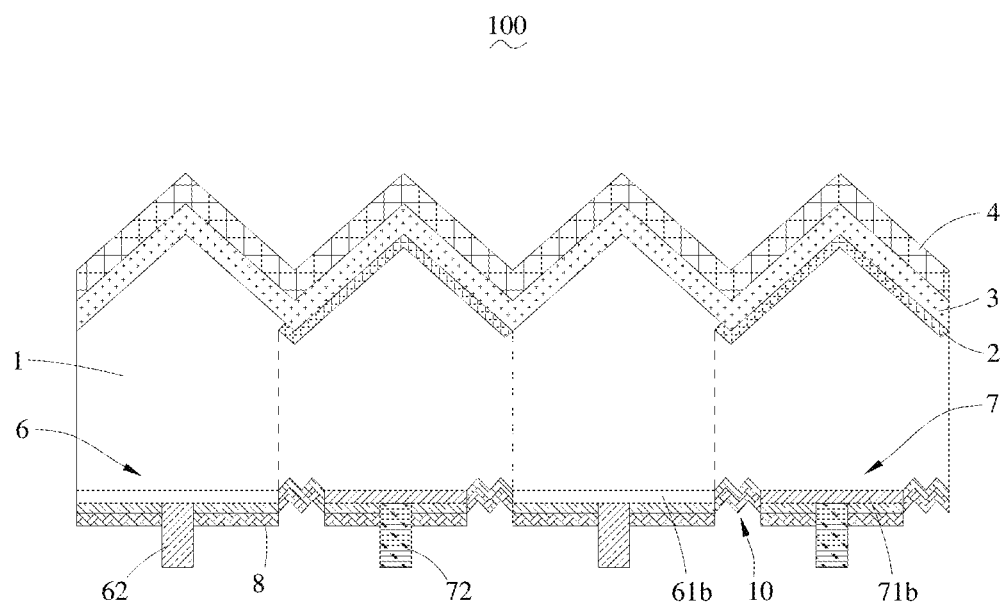
FIG. 6 is a sixth schematic structural diagram of a solar cell according to some embodiments of the present disclosure.
Figure 7:
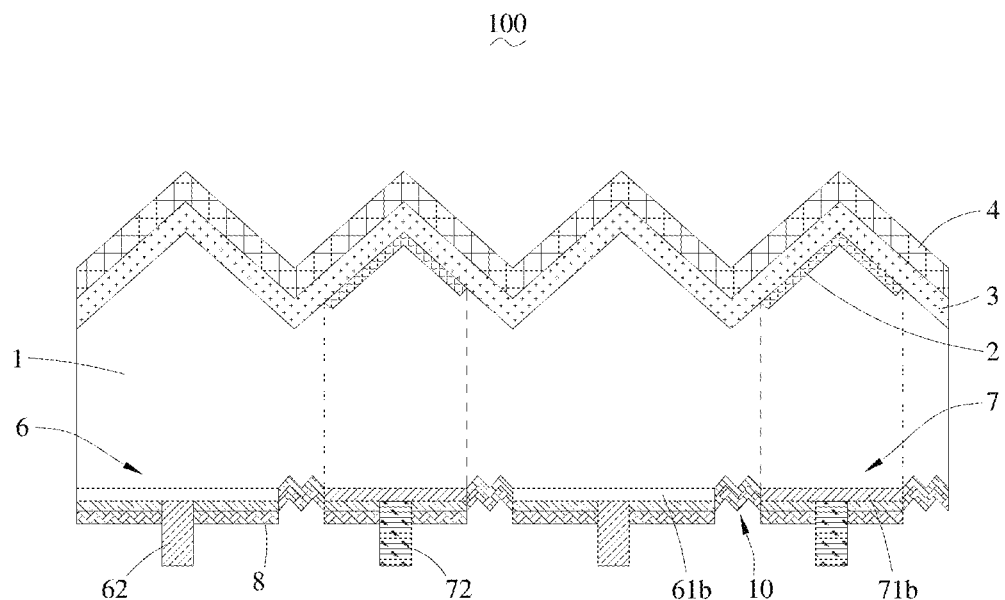
FIG. 7 is a seventh schematic structural diagram of a solar cell according to some embodiments of the present disclosure.
Figure 8:
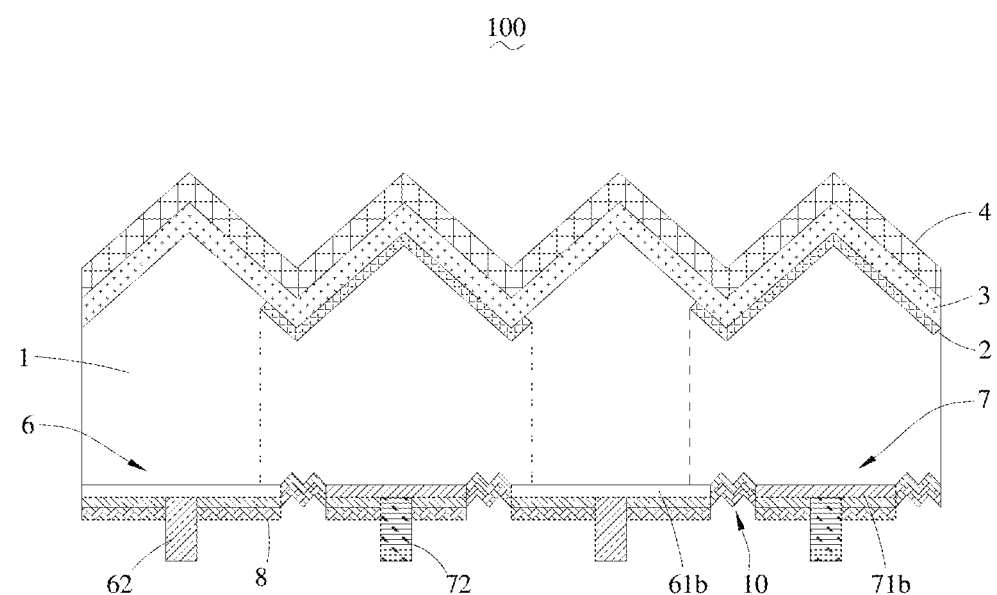
FIG. 8 is an eighth schematic structural diagram of a solar cell according to some embodiments of the present disclosure.
Figure 9:
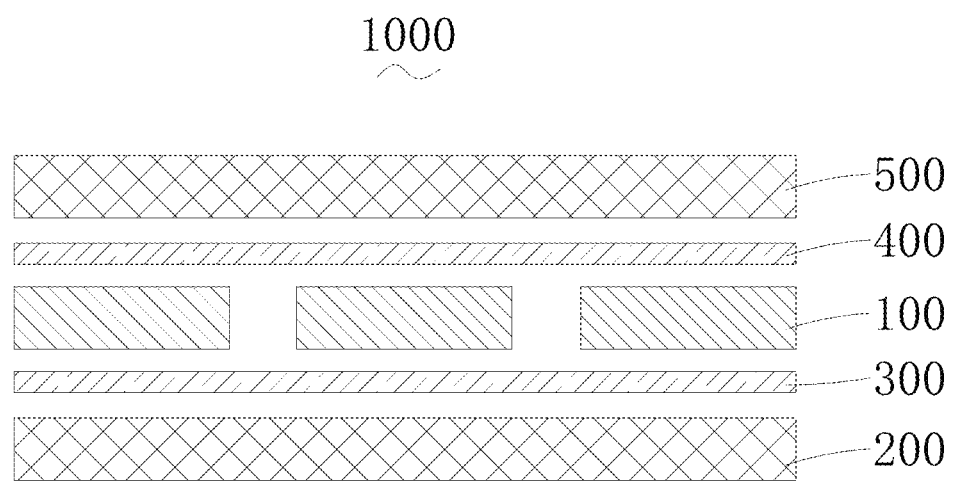
FIG. 9 is a schematic structural diagram of a photovoltaic module according to some embodiments of the present disclosure.

In some embodiments, referring to FIG. 6 to FIG. 8, when the front diffusion layers 2 are in one-to-one correspondence to the second doped regions 71b. Orthographic projections of the second doped regions 71b perpendicular to the front surface of the silicon substrate 1 are within orthographic projections of the front diffusion layers 2 perpendicular to the front surface of the silicon substrate 1.

For example, when the silicon substrate 1 is a P-type substrate, the first doped regions 61b are N-type doped regions, the second doped regions 71b are P-type doped regions, and the front diffusion layers 2 are in one-to-one correspondence to the second doped regions 71b. That is, the front surface field regions are in one-to-one correspondence to the P-type conductive regions 6, and orthographic projections of the P-type conductive regions 6 perpendicular to the front surface of the silicon substrate 1 are within orthographic projections of the front surface field regions perpendicular to the front surface of the silicon substrate 1.

When the silicon substrate 1 is an N-type substrate, the first doped regions 61b are P-type doped regions, the second doped regions 71b are N-type doped regions, and the front diffusion layers 2 are in one-to-one correspondence to the second doped regions 71b. That is, the front surface field regions are in one-to-one correspondence to the N-type conductive regions 7, and orthographic projections of the N-type conductive regions 7 perpendicular to the front surface of the silicon substrate 1 are within orthographic projections of the front surface field regions perpendicular to the front surface of the silicon substrate 1.

According to the related description about the method for manufacturing the solar cell 100, spacing regions 10 are further provided between the first doped regions 61b and the second doped regions 71b. That is, the spacing regions 10 may be part of the silicon substrate 1. After high-temperature annealing, the spacing regions 10 may also be etched by one or more of, for example, dry etching, wet etching and laser etching, to form a groove structure for insulating the first doped regions 61b from the second doped regions 71b, thereby preventing short circuit of the solar cell.

In some embodiments, still referring to FIG. 6, at least part of orthographic projections of the spacing regions 10 perpendicular to the front surface of the silicon substrate 1 may also be within the orthographic projections of the front diffusion layers 2 perpendicular to the front surface of the silicon substrate 1.

In some embodiments, still referring to FIG. 7, orthographic projections of the spacing regions 10 perpendicular to the front surface of the silicon substrate 1 do not overlap orthographic projections of the front diffusion layers 2 perpendicular to the front surface of the silicon substrate 1.

In some embodiments, still referring to FIG. 8, orthographic projections of the spacing regions 10 perpendicular to the front surface of the silicon substrate 1 are within the orthographic projections of the front diffusion layers 2 perpendicular to the front surface of the silicon substrate 1. At least part of orthographic projections of the first doped regions 61b perpendicular to the front surface of the silicon substrate 1 may also be within the orthographic projections of the front diffusion layers 2 perpendicular to the front surface of the silicon substrate 1.

For example, when the silicon substrate 1 is a P-type substrate, the first doped regions 61b are N-type doped regions, and the second doped regions 71b are P-type doped regions. At least part of orthographic projections of the N-type doped regions perpendicular to the front surface of the silicon substrate 1 are within the orthographic projections of the front diffusion layers 2 perpendicular to the front surface of the silicon substrate 1. That is, at least part of orthographic projections of the N-type conductive regions 7 perpendicular to the front surface of the silicon substrate 1 are within the orthographic projections of the front surface field regions perpendicular to the front surface of the silicon substrate 1.

When the silicon substrate 1 is an N-type substrate, the first doped regions 61b are P-type doped regions, and the second doped regions 71b are N-type doped regions. At least part of orthographic projections of the P-type doped regions perpendicular to the front surface of the silicon substrate 1 are within the orthographic projections of the front diffusion layers 2 perpendicular to the front surface of the silicon substrate 1. That is, at least part of orthographic projections of the P-type conductive regions 6 perpendicular to the front surface of the silicon substrate 1 are within the orthographic projections of the front surface field regions perpendicular to the front surface of the silicon substrate 1.

A specific structure of the solar cell 100, such as specific types and parameters of the layers, may be obtained with reference to the related description about the method for manufacturing the solar cell 100, which are not described in detail herein.

In a third aspect, a photovoltaic module is provided. The photovoltaic module includes at least one solar cell string formed by the solar cells (e.g., FIGS. 1-8) described above through electrical connection.

In some embodiments, the photovoltaic module 1000 includes a first cover plate 200, a first packaging adhesive layer 300, a solar cell string, a second packaging adhesive layer 400 and a second cover plate 500.

The solar cell string includes a plurality of solar cells 100 as described above. The solar cells 100 are connected through conductive bands. The solar cells 100 may be connected by partial stacking or by splicing.

The first cover plate 200 and the second cover plate 500 may be transparent or opaque cover plates, for example, glass cover plates or plastic cover plates.

Two sides of the first packaging adhesive layer 300 respectively contact and fit with the first cover plate 200 and the solar cell string, and two sides of the second packaging adhesive layer 400 respectively contact and fit with the second cover plate 500 and the solar cell string. The first packaging adhesive layer 300 and the second packaging adhesive layer 400 may be an ethylene-vinyl acetate copolymer (EVA) adhesive film, a polyethylene octene co-elastomer (POE) adhesive film or a polyethylene terephthalate (PET) adhesive film.

Side edges of the photovoltaic module 1000 may also be completely packaged. That is, the side edges of the photovoltaic module 1000 are fully packaged with a packaging adhesive tape to prevent a lamination deviation during the lamination of the photovoltaic module 1000.

The photovoltaic module 1000 further includes an edge sealing member fixedly packaged to a partial edge of the photovoltaic module 1000. The edge sealing member may be fixedly packaged to an edge near a corner of the photovoltaic module 1000. The edge sealing member may be a high-temperature resistant tape. The high-temperature resistant tape has excellent high-temperature resistance and may not decompose or fall off during the lamination, which can ensure the reliable packaging of the photovoltaic module 1000. Two ends of the high-temperature resistant tape are fixed to the second cover plate 500 and the first cover plate 200, respectively. The two ends of the high-temperature resistant tape may be bonded to the second cover plate 500 and the first cover plate 200, respectively. The middle thereof can limit a side edge of the photovoltaic module 1000 to prevent a lamination deviation of the photovoltaic module 1000 during the lamination.

The above are only preferred embodiments of the present disclosure and are not intended to limit the present disclosure. Any modifications, equivalent substitutions, improvements and the like made within the spirit and principle of the present disclosure should fall within the protection scope of the present disclosure.

What is claimed is:

1. A solar cell, comprising:
   a silicon substrate having a front surface and a back surface arranged opposite to each other;
   P-type conductive regions and N-type conductive regions that are alternately arranged on the back surface of the silicon substrate;
   front surface field regions located on the front surface of the silicon substrate and spaced from each other, wherein each front surface field region corresponds to a corresponding conductive region of the P-type conductive regions or a corresponding conductive region of the N-type conductive regions;
   at least one front passivation layer located on the front surface of the silicon substrate; and
   at least one back passivation layer located on surfaces of the P-type conductive regions and the N-type conductive regions,
   wherein the front surface field regions each have a width in a range from 200 µm to 600 µm, and
   wherein spacing regions are formed between adjacent ones of the P-type conductive regions and the N-type conductive regions.

2. The solar cell according to claim 1, wherein, along a direction perpendicular to a plane of the silicon substrate, projections of the spacing regions are within corresponding projections of the front surface field regions.

3. The solar cell according to claim 1, wherein the spacing regions each have a width in a range from 20 µm to 150 µm.

4. The solar cell according to claim 1, wherein the width of each front surface field region is greater than a sum of a width of the corresponding conductive region of the P-type conductive regions or the corresponding conductive region of the N-type conductive regions, and
   wherein a width of each of the spacing regions at two sides of the corresponding conductive region of the P-type conductive regions or the corresponding conductive region of the N-type conductive regions ranges from 0 µm to 50 µm.

5. The solar cell according to claim 1, wherein, along a direction perpendicular to a plane of the silicon substrate, projections of the spacing regions do not overlap with projections of the front surface field regions.

6. The solar cell according to claim 1, wherein the silicon substrate is an N-type substrate, and the front surface field regions each correspond to one of the N-type conductive regions.

7. The solar cell according to claim 6, wherein, along a direction perpendicular to a plane of the silicon substrate, each projection of the P-type conductive regions adjacent to the corresponding conductive region of the N-type conductive regions is partially within a projection of the front surface field regions corresponding to the corresponding conductive region of the N-type conductive regions.

8. The solar cell according to claim 1, wherein the silicon substrate is a P-type substrate, and the front surface field regions each correspond to one of the P-type conductive regions.

9. The solar cell according to claim 8, wherein, along a direction perpendicular to a plane of the silicon substrate, projections of the N-type conductive regions adjacent to the P-type conductive regions are partially within a projection of a front surface field region corresponding to the corresponding conductive region of the P-type conductive regions.

10. The solar cell according to claim 1, wherein a total area of the front surface field regions accounts for 45% to 60% of an area of the front surface of the silicon substrate.

11. The solar cell according to claim 1, wherein the front surface field regions have a doping concentration in a range from $5E18$ $cm^{-3}$ to $5E19$ $cm^{-3}$.

12. The solar cell according to claim 1, wherein the front surface field regions have a doping junction depth in a range from 20 nm to 150 nm.

13. The solar cell according to claim 1, wherein the front surface field regions have a sheet resistance ranging from 300 Ω/sqr to 1300 Ω/sqr.

14. The solar cell according to claim 1, further comprising:
   at least one dielectric layer formed over the back surface of the silicon substrate and located on surfaces of the P-type conductive regions and the N-type conductive regions facing away from the at least one back passivation layer; and at least one anti-reflection layer formed over a surface of the at least one front passivation layer facing away from the silicon substrate.

15. The solar cell according to claim 14, wherein the at least one dielectric layer has a thickness in a range from 0.5 nm to 2 nm.

16. The solar cell according to claim 14, wherein the at least one anti-reflection layer has a thickness in a range from 40 nm to 100 nm.

17. The solar cell according to claim 1, wherein the at least one front passivation layer has a thickness in a range from 3 nm to 30 nm.

18. The solar cell according to claim 1, wherein the at least one front passivation layer has a thickness in a range from 40 nm to 100 nm.

19. A photovoltaic module, comprising: at least one solar cell string each formed by a plurality of solar cells through an electrical connection, wherein at least one solar cell of the plurality of solar cells comprises:

a silicon substrate having a front surface and a back surface arranged opposite to each other;

P-type conductive regions and N-type conductive regions alternately arranged on the back surface of the silicon substrate;

front surface field regions located on the front surface of the silicon substrate and spaced from each other, wherein each front surface field region corresponds to a corresponding conductive region of the P-type conductive regions or a corresponding conductive region of the N-type conductive regions;

at least one front passivation layer located on the front surface of the silicon substrate; and at least one back passivation layer located on surfaces of the P-type conductive regions and the N-type conductive regions, wherein the front surface field regions each have a width in a range from 200 μm to 600 μm, and wherein spacing regions are formed between adjacent ones of the P-type conductive regions and the N-type conductive regions.

20. The photovoltaic module according to claim 19, wherein the spacing regions each have a width in a range from 20 μm to 150 μm.

* * * * *